United States Patent [19]

Gipstein et al.

[11] 3,961,099

[45] June 1, 1976

[54] THERMALLY STABLE POSITIVE POLYCARBONATE ELECTRON BEAM RESISTS

[75] Inventors: Edward Gipstein, Saratoga, Calif.; Wayne M. Moreau, Wappingers Falls, N.Y.; Omar U. Need, III, San Jose, Calif.

[73] Assignee: International Business Machines Corporation, Armonk, N.Y.

[22] Filed: Sept. 26, 1974

[21] Appl. No.: 509,593

[52] U.S. Cl. .................................. 427/43; 96/35.1; 96/36.2; 96/115 R; 204/159.19; 427/273
[51] Int. Cl.² ........................................... B05D 3/06
[58] Field of Search ................... 117/93.31; 427/43; 204/159.14, 159.19; 96/35.1, 36.2, 115 R

[56] References Cited

UNITED STATES PATENTS

| | | | |
|---|---|---|---|
| 3,043,802 | 7/1962 | Thomas et al. | 96/115 R |
| 3,535,137 | 10/1970 | Haller et al. | 427/43 |
| 3,622,331 | 11/1971 | Thomas | 96/115 R |
| 3,770,697 | 11/1973 | Holub et al. | 204/159.14 |

OTHER PUBLICATIONS

Colebrooke et al. "Chem. Abstr." 81,13810, 7–1974. 443.

*Primary Examiner*—John Newsome
*Attorney, Agent, or Firm*—Joseph G. Walsh

[57] ABSTRACT

Electron beam positive resists which are sensitive to electron beam radiation and simultaneously thermally stable are prepared using polycarbonates.

3 Claims, No Drawings

THERMALLY STABLE POSITIVE POLYCARBONATE ELECTRON BEAM RESISTS

FIELD OF THE INVENTION

The present invention is concerned with positive electron beam resists. In particular, it is concerned with such resists which are made of polycarbonates and which possess the advantage of being thermally stable.

PRIOR ART

Polycarbonate materials are known to the prior art. The prior art is also acquainted with other materials useful as electron beam resists. The present invention, however, has the unexpected advantage of providing materials which are simultaneously sensitive to electron beam radiation and stable to heat.

SUMMARY OF THE INVENTION

The present invention relates to a process for forming an image with a high resolution radiation sensitive thermally stable positive resist. According to the present invention, polycarbonate materials are employed.

In the process of the present invention a film layer of polycarbonate is applied to a substrate and the portions of the layer to be removed are exposed to an electron beam or other radiation which acts to reduce the molecular weight of the polymer in the energy struck areas. The polymer in the energy struck areas is then selectively removed with a solvent developer solution which preferably dissolves the lower molecular weight material leaving a patterned protective layer of polymer covering the unexposed areas. Such processes are especially suitable for use in the manufacture of high density microcircuits because of the high resolution obtainable by the use of electron beam exposure.

Suitable solvents should have boiling points which are below the decomposition point of the polymer to permit removal of the solvent from the cast film by heating. Examples of suitable solvents are aliphatic and aromatic hydrocarbons such as, for example, toluene, cyclohexanone, benzene, chlorobenzene, butyl acetate, ethylacetate, chloroform, acetone, dioxane, xylene, methyl ethyl ketone, methyl isobutyl ketone and dimethyl sulfoxide.

The films can be cast in various thicknesses of from about 50 A to about 10 microns as is conventional in the art depending upon the intended use of the resist image. For example, about 0.5 to about 2.0 microns for an etch process or from about 1.5 to about 3 microns for a lift-off metallurgy process. The casting process is conventional such as by spinning or dip cast.

It is preferred to prebake the resist film in air or vacuum at a temperature usually above the glass transition temperature of the polymer but below the thermal decomposition temperature. The prebake removes traces of solvent and anneals out any strains in the film. Suitable baking temperatures range from about 25°C to a few degrees below the polymer decomposition temperature.

The resist is exposed patternwise to radiation such as, for example, ultraviolet, visible light, electron beam, X-ray, and gamma radiation which acts to rapidly degrade the polymer. The sensitivity of the polymers make them particularly useful for a process employing low energy electron beam radiation of from about 10 to about 30 KeV with charge densities of from about $3 \times 10^{-6}$ coul/cm$^2$ to about 1 coul/cm$^2$ as is known in the art. The dosage required can be reduced by heating the polymer during exposure.

In one aspect of the invention, the image is solvent developed using solvents which preferentially dissolve the lower molecular weight degraded polymer in the exposed portions of the film. Suitable solvents include, for example, toluene, methyl isobutyl ketone, butyl acetate, 1,4-dichlorobutane, xylene, cyclohexanone, cellosolve acetate, benzene and chlorobenzene. The development rate can be adjusted by heating or cooling the solvent.

The solvent development is carried out preferably in the temperature range of from about 10°C to about 50°C. Three types of development processes can be used. In the first a good solvent for both the exposed and unexposed polymer is used to gain speed with the resist thickness adjusted so that the remaining unexposed resist film is thick enough to protect the substrate during the subsequent treatment. Alternatively, a solvent for the exposed areas only is employed. In the third type of development a mixture of a solvent for both the exposed and unexposed polymer and a solvent for the exposed polymer only is used. The optimum development time is determined for each case by the factors of exposure dosage, film thickness, solvent system and solvent temperature as known by one skilled in the art.

The patterned resist image requires no postbake and has high resolutions of less than the film thickness. For example, 0.50 micron images line and space in a film thickness of 1.0 micron.

The resist films can be solvent stripped from the substrate following the etch process. Suitable stripping solvents are solvents such as, for example, aliphatic and aromatic hydrocarbons, ketones, and acetates which are heated from about 21°C to 100°C. One solvent can serve in the process as the casting solvent, the developer, and the stripper by adjusting the processing temperature. For example, 1,2-dichloroethane can be used at room temperature to apply and develop the resist and 1,6-dichlorohexane can be used at 50°C to strip the resist.

Polycarbonates are known in the prior art and their preparation may be found in the chemical literature. Those particularly useful in the process of the present invention are materials having the formula

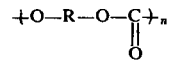

wherein R may be either alkyl or aryl.

By the process of the present invention it is possible to form resists which are sensitive to electron beam radiation and are thermally stable up to about 400°C. This increased thermal stability compared to prior art materials increases the usefulness of resist materials. One of the major advantages of a positive resist over a negative resist is the application to the metal lift-off process. The depositon of metal film followed by dissolution of the resist underlay produces straight-walled image down to 0.1 microns in width. The resist acts as a deposition mask for the metal overlay. When prior art resist material is used the silicon wafer substrate must be cooled to prevent heating the resist above about 100°C. If the substrate temperature rises above 100°C the resist film will collapse and the images will flow shut. Since the metal film is deposited from the vapor at a temperature of about 400°C large grains in metals films are formed by growth on a cooled substrate. The large gradient from vapor to solid film induces localized defects and electrical failure. However, when the polycarbonate resists of the present invention are used, they may be heated to at least 200°C and in some cases close to 400°C, thereby providing small grains with minimum defects when a metal film is deposited.

The following example is given solely for purpose of illustration and is not to be considered limitation on the invention, many variations of which are possible without departing from the spirit or scope thereof.

EXAMPLE

These polymers are thermally stable to degradation and melting to at least 225°C. The most preferred polycarbonate [poly(2,2-propanebis-4-phenyl carbonate)] (I) was tested for its sensitivity. It required only a minimum dose of $3 \times 10^{-6}$ coul/cm$^2$ at 15KV. The high radiation sensitivity of this polymer is surprising, since aromatic groups in a polymer main chain or as side chain are inhibitors of polymer degradation. The susceptibility to radiation may be due to localized scission of the carbonate linkage with elimination of $CO_2$.

The cast film of I was exposed with a 1$\mu$ spot at a decreasing series of dose at 15KV. The film was developed in 1,6-dichlorohexane. One half of the unexposed film (3500Å) remained after development of $3 \times 10^{-6}$ coul/cm$^2$. The image was stable to 260°C heat for 3 hours.

What is claimed is:

1. A process for forming an image with a high resolution radiation sensitive thermally stable positive resist comprising the steps of:
    1. forming on a substrate a film comprising a propanebis-4-phenyl polycarbonate,
    2. exposing said film in a predetermined pattern to radiation, and
    3. removing the radiation exposed position of said film with a solvent.

2. A process as claimed in claim 1 wherein the radiation is low energy electron beam radiation of from about 10 to about 30 KeV.

3. A process as claimed in claim 1 wherein a thin film of metal is deposited on the polycarbonate film after exposure to radiation and before treatment with a solvent.

* * * * *